United States Patent
Jeon

(10) Patent No.: US 9,390,996 B2
(45) Date of Patent: Jul. 12, 2016

(54) DOUBLE-SIDED COOLING POWER MODULE AND METHOD FOR MANUFACTURING THE SAME

(71) Applicant: Hyundai Motor Company, Seoul (KR)

(72) Inventor: Woo-Yong Jeon, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/865,578

(22) Filed: Sep. 25, 2015

(65) Prior Publication Data

US 2016/0126157 A1 May 5, 2016

(30) Foreign Application Priority Data

Oct. 29, 2014 (KR) .................. 10-2014-0148115

(51) Int. Cl.
| | |
|---|---|
| *H01L 25/00* | (2006.01) |
| *H01L 23/367* | (2006.01) |
| *H01L 25/18* | (2006.01) |
| *H01L 23/043* | (2006.01) |
| *H01L 23/373* | (2006.01) |
| *H01L 23/492* | (2006.01) |
| *H01L 23/31* | (2006.01) |
| *H01L 23/00* | (2006.01) |
| *H01L 21/52* | (2006.01) |
| *H01L 21/48* | (2006.01) |

(Continued)

(52) U.S. Cl.
CPC ........ *H01L 23/3675* (2013.01); *H01L 21/4882* (2013.01); *H01L 21/52* (2013.01); *H01L 21/565* (2013.01); *H01L 23/043* (2013.01); *H01L 23/3107* (2013.01); *H01L 23/3735* (2013.01); *H01L 23/3736* (2013.01); *H01L 23/4924* (2013.01); *H01L 24/32* (2013.01); *H01L 24/83* (2013.01); *H01L 25/165* (2013.01); *H01L 25/18* (2013.01); *H01L 25/50* (2013.01); *H01L 2224/32245* (2013.01); *H01L 2224/83801* (2013.01); *H01L 2924/01029* (2013.01); *H01L 2924/1203* (2013.01)

(58) Field of Classification Search
CPC ..... H01L 23/36; H01L 25/18; H01L 21/4825; H01L 23/34; H01L 24/33; H01L 23/4334; H01L 23/49524; H01L 23/49575; H01L 23/492; H01L 2924/13055; H01L 25/072; H01L 2924/13091; H01L 2924/1305; H01L 2924/181

See application file for complete search history.

(56) References Cited

U.S. PATENT DOCUMENTS 4,710,795 A * 12/1987 Nippert ............. H01L 23/49844
257/692
8,541,875 B2 9/2013 Bennion et al.
(Continued)

FOREIGN PATENT DOCUMENTS

| JP | 2013-033876 A | 2/2013 |
|---|---|---|
| JP | 2014-072939 A | 4/2014 |

(Continued)

*Primary Examiner* — Roy Potter
(74) *Attorney, Agent, or Firm* — Mintz Levin Cohn Ferris Glovsky and Popeo, P.C.; Peter F. Corless

(57) ABSTRACT

A double-sided cooling power module may include a lower-end terminal, at least one pair of power semiconductor chips mounted on the lower-end terminal, at least one pair of horizontal spacers mounted on the at least one pair of power semiconductor chips, an upper-end terminal mounted on the at least one pair of horizontal spacers, and at least one pair of vertical spacers disposed between the upper-end terminal and the lower-end terminal.

20 Claims, 11 Drawing Sheets

(51) Int. Cl.
*H01L 21/56* (2006.01)
*H01L 25/16* (2006.01)

(56) References Cited

U.S. PATENT DOCUMENTS

2010/0230798 A1* 9/2010 Nikitin .............. H01L 23/49513
257/690
2010/0230800 A1* 9/2010 Beaupre .............. H01L 23/3735
257/691
2014/0185243 A1* 7/2014 Joo ....................... H01L 23/473
361/709
2016/0005675 A1* 1/2016 Tong ................... H01L 23/4334
257/675

FOREIGN PATENT DOCUMENTS

| KR | 10-2013-0029267 A | 3/2013 |
| KR | 10-1331724 | 11/2013 |
| KR | 10-2014-0084590 | 7/2014 |

* cited by examiner

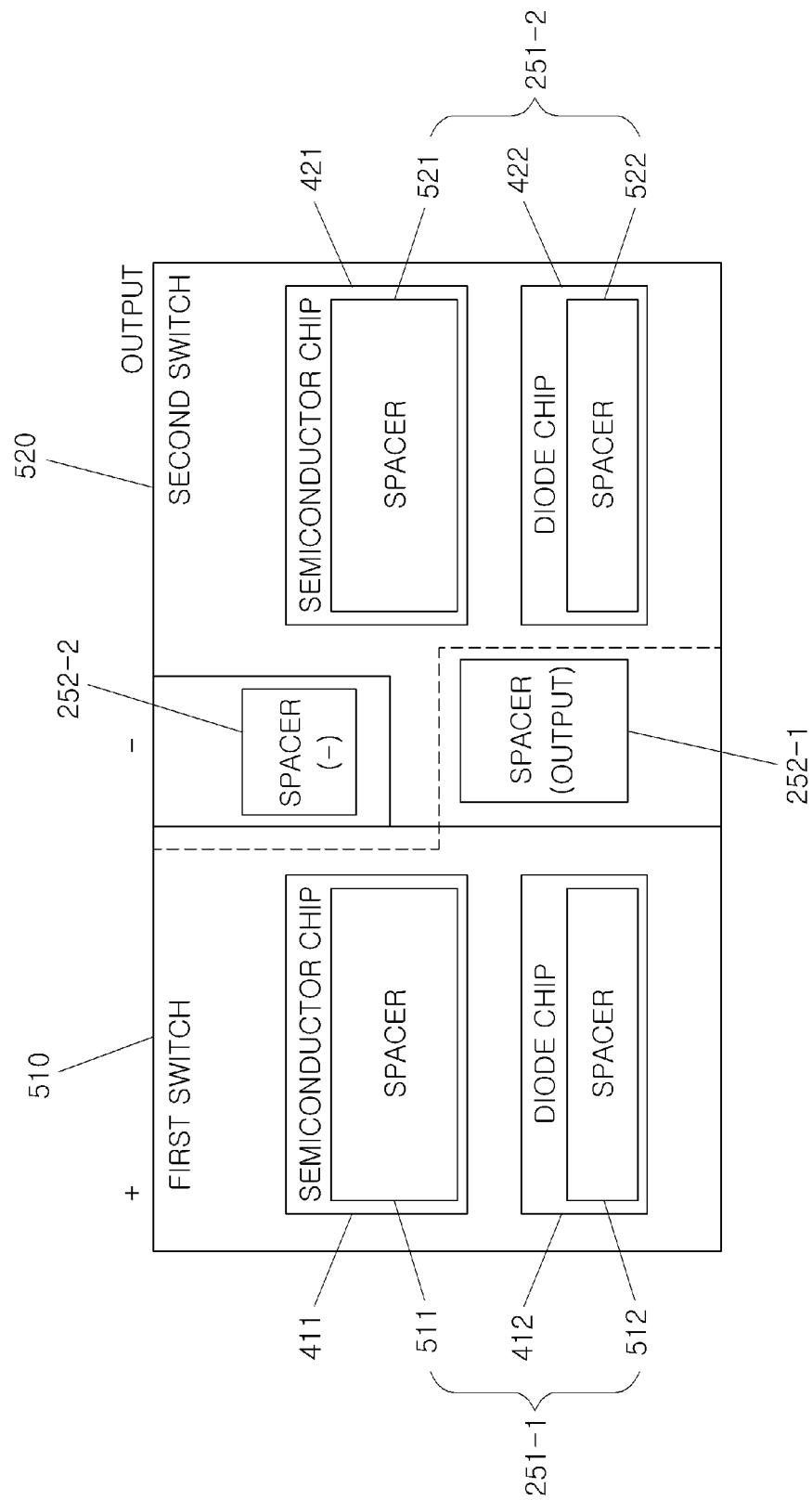

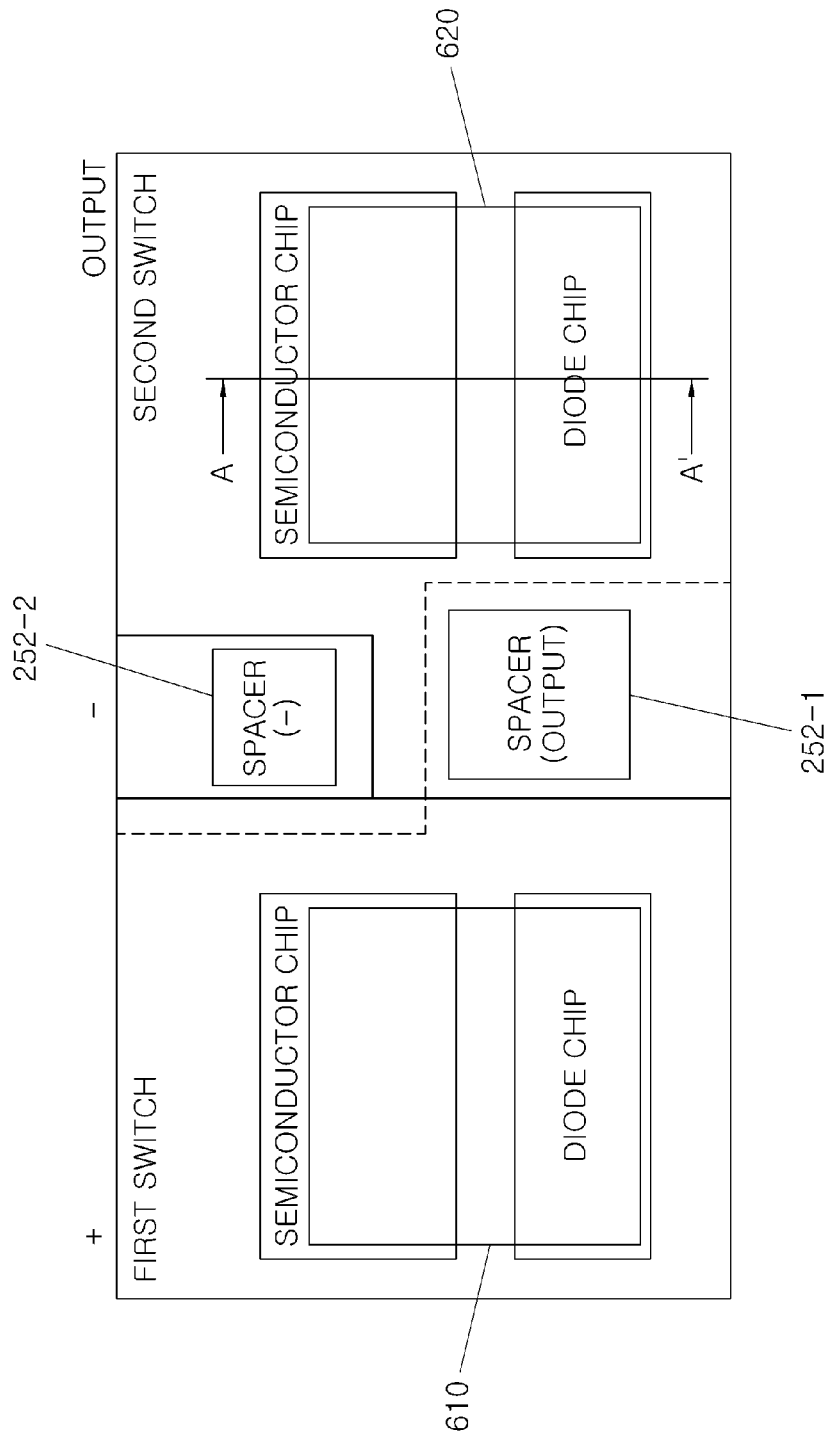

DOUBLE-SIDED COOLING POWER MODULE AND METHOD FOR MANUFACTURING THE SAME

CROSS-REFERENCE TO RELATED APPLICATION

This application claims the benefit of and priority to Korean Patent Application No. 10-2014-0148115 filed on Oct. 29, 2014, the entire contents of which are incorporated herein by reference.

BACKGROUND OF THE DISCLOSURE

1. Technical Field

Embodiments of the present disclosure relate generally to a power module of an inverter for a vehicle, and, more particularly, to a double-sided cooling power module including a spacer which has a structure and/or a shape capable of achieving mechanical support and/or electrical connection considering insulation by applying a ceramic substrate a face in contact with a double-sided cooler for electrical insulation of a power module, and a manufacturing method thereof.

2. Description of Related Art

In general, environmentally friendly vehicles employ a motor as a driving means. The typical motor is driven by phase current transferred through a power cable from an inverter, which converts a direct current voltage into a 3-phase voltage by a pulse width modulation (PWM) signal of a controller. In addition, the inverter is connected to a power module, which is supplied with direct current (DC) power from a battery and supplies power for driving the motor.

Generally, a power module is configured in a form such that six or three phases are integrated into one package. Since a power module generates heat by supply of power, various schemes for cooling the generated heat are applied to the power module for a stable operation.

FIG. 1 is a cross-sectional view illustrating a power module using a normal double-sided cooling scheme. Referring to FIG. 1, copper plates 120 on the ends of which power terminals 110 are formed are disposed at top and bottom, and a chip 130 is connected to a signal terminal 160 through a wire 140. A spacer 150 is provided between the chip 130 and the copper plate 120.

When the power module is configured as shown in FIG. 1, the internal circuit configuration thereof is complicated, so that it is difficult to implement more than one switch among six switches of an inverter circuit. In addition, since an electric insulating treatment is not performed on the outside thereof, a separate insulating sheet having a low thermal conductivity (e.g., approximately 5-10 W/mK) or the like is required to be applied, so that thermal characteristics are deteriorated. Further, wire bonding is usually used for connection of the chip to the signal terminal, so that, for such a height, a space structure having a wide width is required.

SUMMARY OF THE DISCLOSURE

Provided is a double-sided cooling power module which can improve a thermal performance and reliability by promoting two-way heat radiation. Embodiments of the present disclosure are directed to a double-sided cooling power module having improved thermal performance and enhanced reliability by implementing two-way heat radiation, and a manufacturing method thereof. Furthermore, embodiments of the present disclosure are directed to a double-sided cooling power module which can achieve simplification of process and reduction of manufacturing cost by improving the manufacturing process, and a manufacturing method thereof.

Other objects and advantages of the present disclosure can be understood by the following description, and become apparent with reference to the embodiments of the present disclosure. Also, it is obvious to those skilled in the art to which the present disclosure pertains that the objects and advantages of the present disclosure can be realized by the means as claimed and combinations thereof.

In accordance with embodiments of the present disclosure, a double-sided cooling power module includes: a lower-end terminal; at least one pair of power semiconductor chips mounted on the lower-end terminal; at least one pair of horizontal spacers mounted on the at least one pair of power semiconductor chips; an upper-end terminal mounted on the at least one pair of horizontal spacers; and at least one pair of vertical spacers disposed between the upper-end terminal and the lower-end terminal.

In this case, the at least one pair of vertical spacers may be configured to adjust a height between the upper-end terminal and the lower-end terminal.

In addition, the at least one pair of vertical spacers may be configured to electrically connect the upper-end terminal to the lower-end terminal.

In addition, the at least one pair of vertical spacers and the at least one pair of horizontal spacers may be made of a conductive ceramic material.

In addition, the at least one pair of horizontal spacers may be configured to have a gradient so that an area of the at least one pair of horizontal spacers in contact with the upper-end terminal can be wider than an area of the at least one pair of horizontal spacers in contact with the at least one pair of power semiconductor chips.

In addition, the upper-end terminal may include: a first copper plate configured to form an output terminal and one electrode terminal; a second copper plate configured to be contacted by an external component; and a conductive ceramic plate disposed between the first copper plate and the second copper plate.

In addition, the lower-end terminal may include: a first copper plate configured to form an output terminal and two electrode terminals with the output terminal therebetween; a second copper plate configured to be contacted by an external component; and a conductive ceramic plate disposed between the first copper plate and the second copper plate.

In addition, the upper-end terminal or the lower-end terminal may be made of direct bonded copper (DBC).

In addition, the at least one pair of power semiconductor chips may be configured to include a semiconductor chip portion and a diode chip portion, and the at least one pair of horizontal spacers may include a pair of spacers which face the semiconductor chip portion and the diode chip portion, respectively.

Otherwise, the at least one pair of power semiconductor chips may be configured to include a semiconductor chip portion and a diode chip portion, and the at least one pair of horizontal spacer may include a spacer having a unified shape so as to face both of the semiconductor chip portion and the diode chip portion.

In addition, the at least one pair of vertical spacers may be configured to connect electrode terminals or output terminals having an equal polarity to each other.

In addition, the at least one pair of power semiconductor chips and the upper-end terminal, the at least one pair of horizontal spacers and the at least one pair of power semiconductor chips, and the at least one pair of horizontal spacers and the upper-end terminal may be respectively attached to one another via soldering.

In addition, the double-sided cooling power module may further include a housing configured by molding in a state in which the lower-end terminal, the at least one pair of power semiconductor chips, the at least one pair of horizontal spacers, the upper-end terminal, and the at least one pair of vertical spacers have been assembled.

Furthermore, in accordance with embodiments of the present disclosure, a method for manufacturing double-sided cooling power module, includes: preparing a lower-end terminal; mounting at least one pair of power semiconductor chips on the lower-end terminal; mounting at least one pair of horizontal spacers on the at least one pair of power semiconductor chips; mounting at least one pair of vertical spacers to be spaced by a predetermined distance from the at least one pair of horizontal spacers; and mounting an upper-end terminal on the at least one pair of horizontal spacers and the at least one pair of vertical spacers. The at least one pair of vertical spacers may be disposed between the upper-end terminal and the lower-end terminal.

In this case, the method may include attaching the at least one pair of power semiconductor chips and the upper-end terminal, the at least one pair of horizontal spacers and the at least one pair of power semiconductor chips, and the at least one pair of horizontal spacers and the upper-end terminal to one another, respectively, using a soldering scheme.

In addition, the method may further include forming a housing by molding in a state in which the lower-end terminal, the at least one pair of power semiconductor chips, the at least one pair of horizontal spacers, the upper-end terminal, and the at least one pair of vertical spacers have been assembled.

BRIEF DESCRIPTION OF THE DRAWINGS

FIG. 5 is a plane view showing an example of an internal layout of the double-sided cooling power module shown in FIG. 2;

FIG. 6A is a plane view showing another example of an internal layout of the double-sided cooling power module shown in FIG. 2;

DETAILED DESCRIPTION OF EMBODIMENTS

Figure 1:
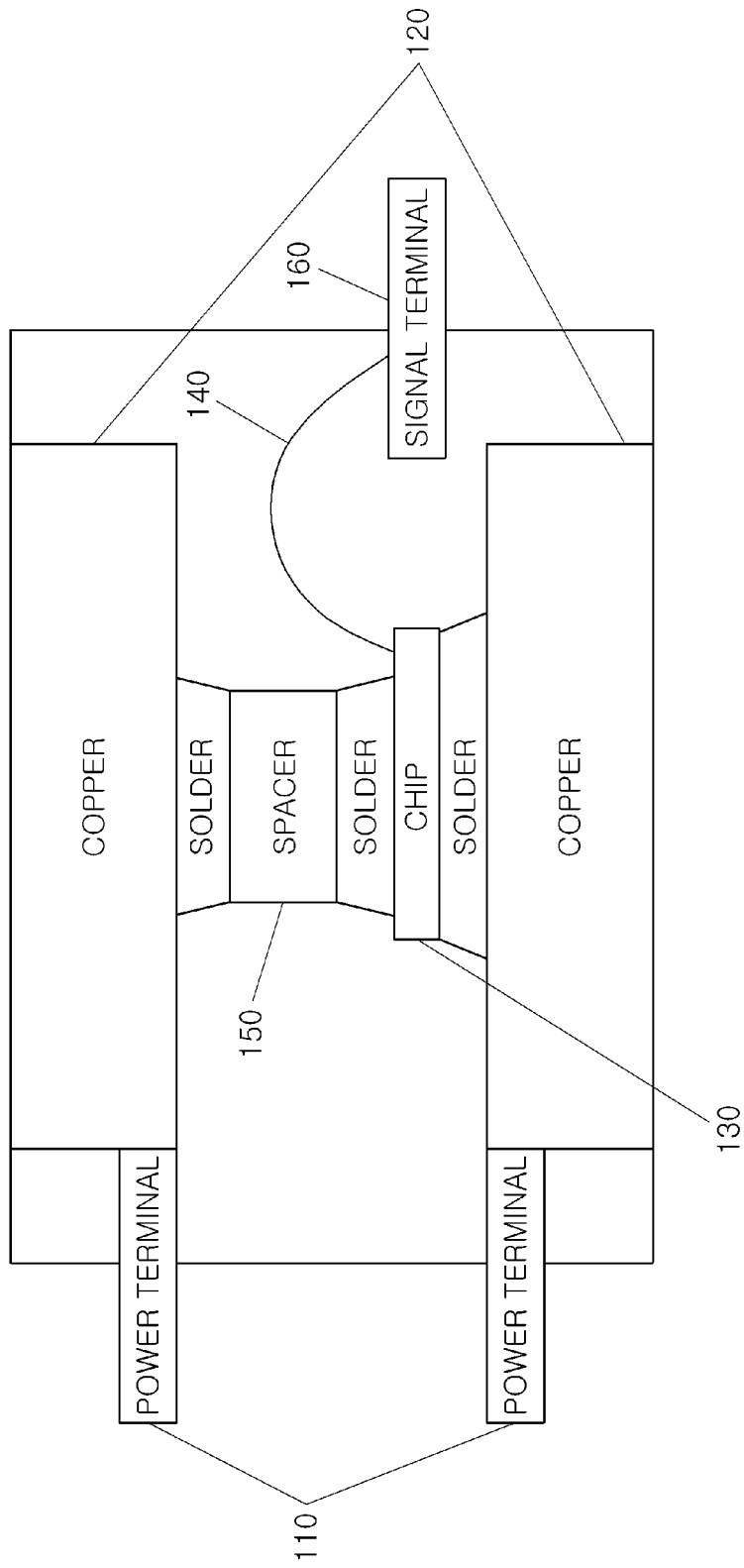
FIG. 1 is a cross-sectional view illustrating a power module using a normal double-sided cooling scheme.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. To clearly explain the present disclosure, the parts which have no relation with the explanation are omitted, and throughout the disclosure, like reference numerals refer to like parts throughout the various figures and embodiments of the present disclosure.

In the drawings, the thickness of layers and regions are exaggerated for clarity. Like reference numerals designate like elements throughout the specification. When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle. On the contrary, when it is mentioned that a part is just above other part, this means that there is no still another part in their middle. In addition, when it is mentioned that a first portion is "entirely" formed on a second portion, this means not only that the first portion is formed on the entire surface (or the whole surface) of the second portion but also that the first portion is not formed on a part of the edge thereof.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Hereinafter, a double-sided cooling power module and a manufacturing method thereof in accordance with an embodiment of the present disclosure will be described in detail with reference to the accompanying drawings.

Figure 2:
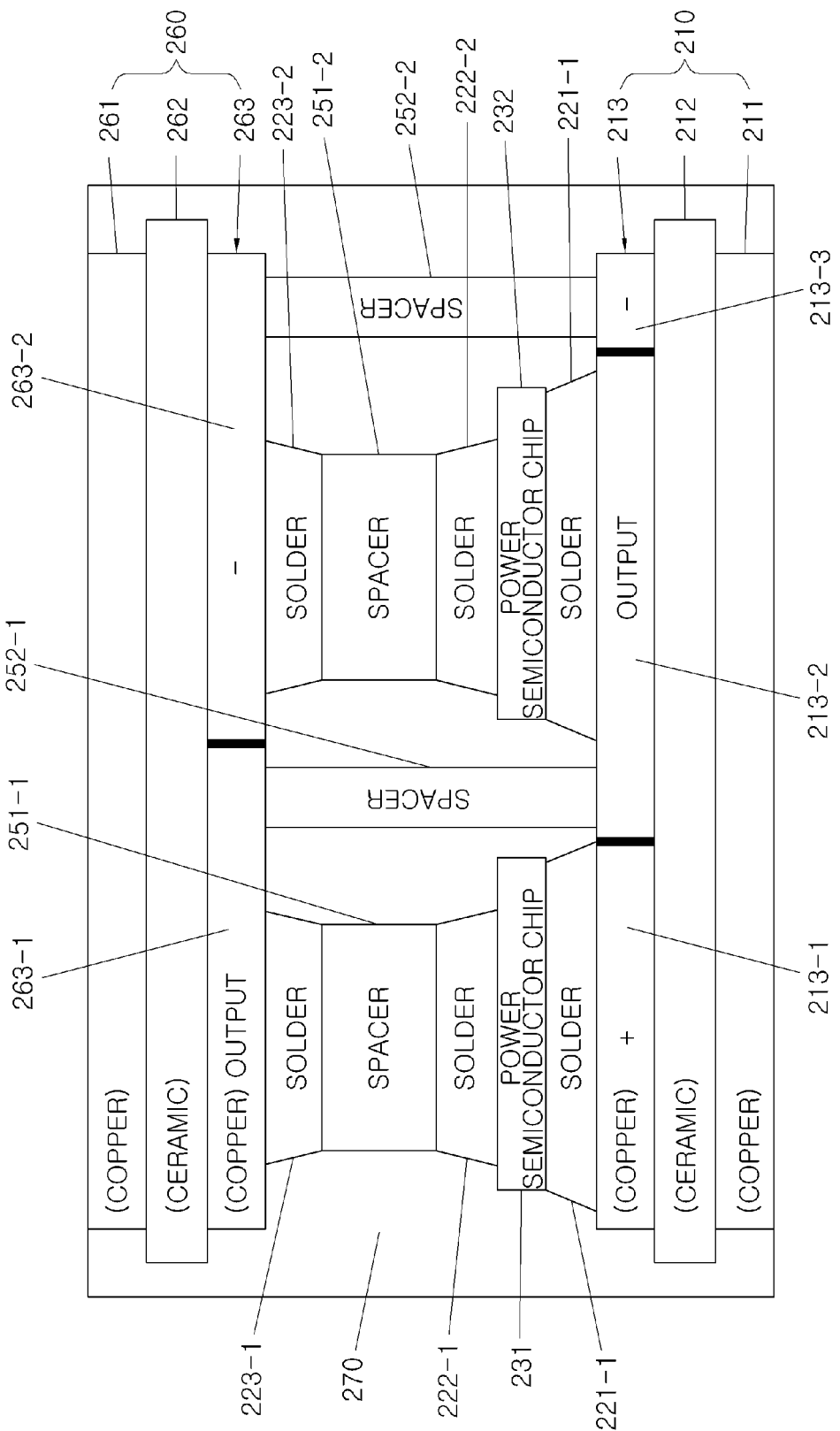
FIG. 2 is a cross-sectional view illustrating a double-sided cooling power module in accordance with an embodiment of the present disclosure.

FIG. 2 is a cross-sectional view illustrating a double-sided cooling power module 200 in accordance with embodiments of the present disclosure. As shown in FIG. 2, the double-sided cooling power module 200 includes a lower-end terminal 210, first and second power semiconductor chips 231 and 232 mounted on the low-end terminal 210, first and second horizontal spacers 251-1 and 251-2 mounted on the first and second power semiconductor chips 231 and 232, an upper-end terminal 260 mounted on the first and second horizontal spacers 251-1 and 251-2, and first and second vertical spacers 252-1 and 252-2 disposed between the upper-end terminal 260 and the low-end terminal 210.

The low-end terminal 210 includes a first copper plate 213 for forming a second output terminal 213-2, and forming a positive electrode terminal (+) 213-1 and a first negative electrode terminal (−) 213-3 with the second output terminal 213-2 therebetween, a second copper plate 211 for contacting with an external component (e.g., a cooler), and a conductive ceramic plate 212 disposed between the first copper plate 213 and the second copper plate 211.

A direct bonded copper (DBC) similar to the aforementioned structure may be used as the low-end terminal 210. In addition, the low-end terminal 210 can be easily insulated through circuit patterning on a ceramic substrate, or may be divided according to each area as shown in FIG. 2.

In addition, the upper-end terminal 260 includes a first copper plate 263 for forming a first output terminal 263-1 and a second negative electrode terminal (−) 263-2, a second copper plate 261 for contacting with an external component (e.g., a cooler), and a conductive ceramic plate 262 disposed between the first copper plate 263 and the second copper plate 261. A DBC may be used as the upper-end terminal 260.

The first power semiconductor chip 231 is mounted on the upper surface of the lower-end terminal 210. In this case, the positive electrode terminal (+) 213-1 of the lower-end terminal 210 and the first power semiconductor chip 231 are joined to each other in a soldering scheme. That is to say, the positive electrode terminal (+) 213-1 and the first power semiconductor chip 231 are joined to each other by a 1-$1^{st}$ solder layer 221-1.

The first horizontal spacer 251-1 is mounted on the upper surface of the first power semiconductor chip 231. It goes with saying that the first power semiconductor chip 231 and the first horizontal spacer 251-1 are joined to each other by a 1-$2^{nd}$ solder layer 222-1.

The first output terminal 263-1 of the upper-end terminal 260 is mounted on the upper surface of the first horizontal spacer 251-1. It goes with saying that the first output terminal 263-1 and the first horizontal spacer 251-1 are joined to each other by a 1-$3^{rd}$ solder layer 223-1.

Similarly, the second power semiconductor chip 232 is mounted on the upper surface of the lower-end terminal 210. In this case, the second output terminal 213-2 of the lower-end terminal 210 and the second power semiconductor chip 232 are joined to each other in a soldering scheme. That is to say, the second output terminal 213-2 and the second power semiconductor chip 232 are joined to each other by a 2-$1^{st}$ solder layer 221-2.

The second horizontal spacers 251-2 is mounted on the upper surface of the second power semiconductor chip 232. It goes without saying that the second power semiconductor chip 232 and the second horizontal spacers 251-2 are joined to each other by a 2-$2^{nd}$ solder layer 222-2.

The second negative electrode terminal (−) 263-2 of the upper-end terminal 260 is mounted on the upper surface of the second horizontal spacers 251-2. It goes without saying that the second negative electrode terminal (−) 263-2 and the second horizontal spacers 251-2 are joined to each other by a 2-$3^{rd}$ solder layer 223-2. That is to say, in a state in which an area is electrically divided, current flows from the positive electrode terminal (+) 213-1 to the first output terminal 263-1 of the upper-end terminal 260 through the first power semiconductor chip 231 and the first horizontal spacer 251-1. Then, the current flows to the output unit 263-1, a first vertical spacer 252-1, and the second output terminal 213-2 of the lower-end terminal 210. In addition, the current flows to the first negative electrode terminal (−) 263-3 of the lower-end terminal 210 through the second negative electrode terminal (−) 263-2 and the second vertical spacer 252-2.

Although embodiments of the present disclosure have been described about a case in which joining is achieved by the solder layers 221-1, 222-1, 223-1, 221-2, 222-2 and 223-2, the present disclosure is not limited thereto, and an electrical conductive adhesive may be used.

The first vertical spacer 252-1 is provided between the first power semiconductor chip 231 and the second power semiconductor chip 232, and connects the output terminal 213-2 of the lower-end terminal 210 and the first output terminal 263-1 of the upper-end terminal 260. In addition, the second vertical spacer 252-2 is provided at the right side of the second power semiconductor chip 232, and connects the first negative electrode terminal (−) 213-3 of the lower-end terminal 210 and the second negative electrode terminal (−) 263-2 of the upper-end terminal 260.

The vertical spacers 252-1 and 252-2 and/or the horizontal spacers 251-1 and 251-2 may be made of a conductive ceramic material. The first and second horizontal spacers 251-1 and 251-2 functions to adjust the height between the upper-end terminal 260 and the lower-end terminal 210. In addition, the first and second horizontal spacers 251-1 and 251-2 perform an electric connection. In addition, the vertical spacers 252-1 and 252-2 connect electrode terminals and/or output terminals having the same polarity to each other.

The vertical spacers 252-1 and 252-2 and/or the horizontal spacers 251-1 and 251-2 function as electrical and/or thermal paths. Thus, the vertical spacers 252-1 and 252-2 and/or the horizontal spacers 251-1 and 251-2 must have an excellent electrical and/or thermal conductivity, and must be made of a material having a thermal expansion coefficient which is similar to those of the power semiconductor chips 231 and 232, the upper-end terminal 260, the lower-end terminal 210, and the like, for ensuring the reliability of a package.

For this reason, in accordance with embodiments of the present disclosure, conductive ceramic is used instead of a metal-based material, such as copper or aluminum.

The power semiconductor chips 231 and 232 may be configured with: a semiconductor switching element, such as a field effect transistor (FET), a metal oxide semiconductor FET (MOSFET), an insulated gate bipolar mode transistor (IGBT), a power rectifier diode, or the like; a thyristor; a gate turn-off (GTO) thyristor; a TRIAC; a silicon controlled rectifier (SCR); an integrated circuit (IC) circuit; or the like. Specially, in the case of a semiconductor device, a bipolar, a power metal oxide silicon field effect transistor (MOSFET) device, or the like. The power MOSFET device operates on a high voltage and high current, and thus has a double-diffused metal oxide semiconductor structure, differently from normal MOSFETs.

In addition, the double-sided cooling power module 200 includes a housing 270 formed by molding. As a material for the molding, an epoxy mold compound or the like may be used.

Figure 3:
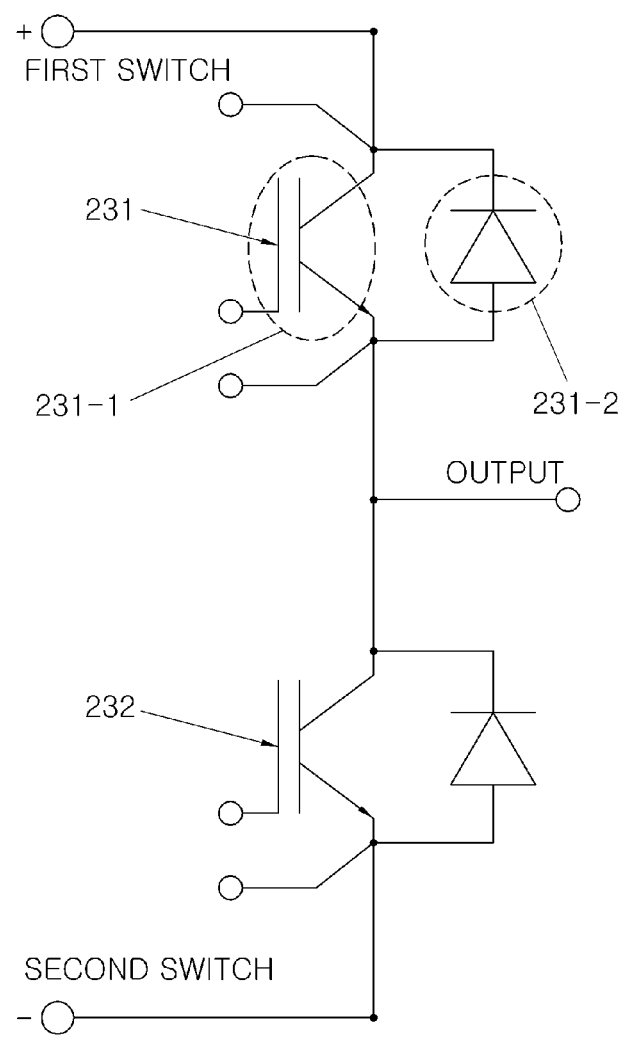
FIG. 3 is an equivalent circuit diagram of the double-sided cooling power module shown in FIG. 2.

FIG. 3 is an equivalent circuit diagram of the double-sided cooling power module shown in FIG. 2. As shown in FIG. 3, the first power semiconductor chip 231 is configured as a first switch, and the second power semiconductor chip 232 is configured as a second switch. The first power semiconductor chip 231 is configured with a semiconductor 231-1 and a diode 231-2. It goes without saying that the second power semiconductor chip 232 has the same structure as the first power semiconductor chip 231.

Figure 4:
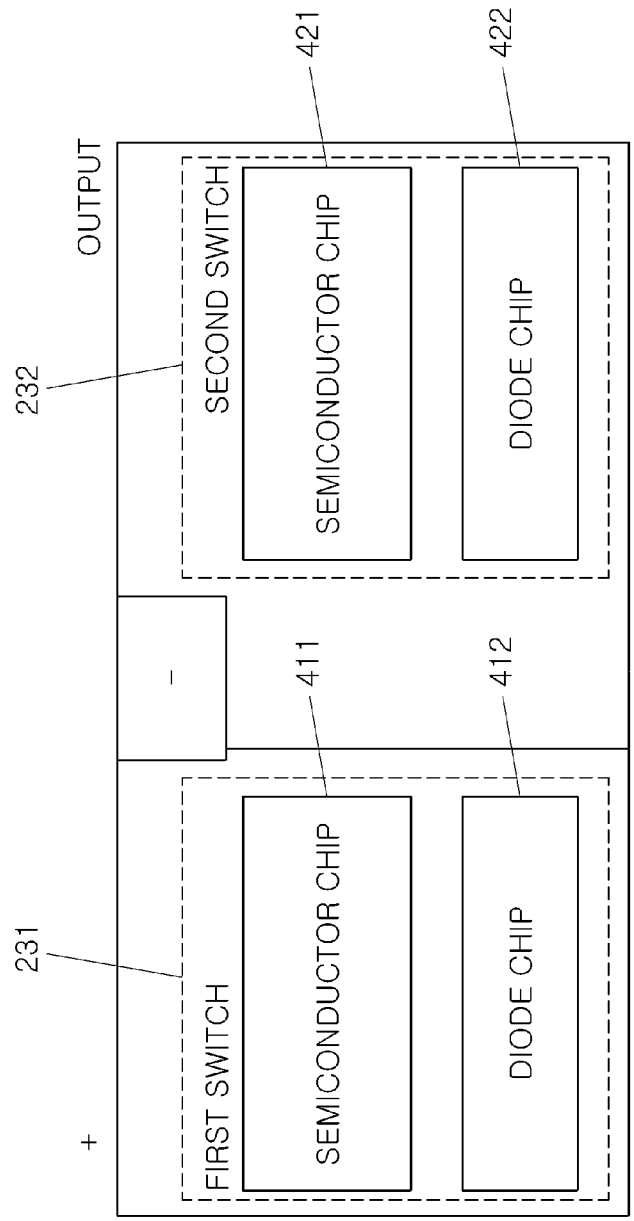
FIG. 4 is a plane view illustrating an internal layout of the double-sided cooling power module shown in FIG. 3.

FIG. 4 is a plane view illustrating an internal layout of the double-sided cooling power module 200 shown in FIG. 3. As shown in FIG. 4, the first power semiconductor chip 231, which is the first switch, is configured with a first semiconductor chip 411 and a first diode chip 412; and the second power semiconductor chip 232, which is the second switch, is configured with a second semiconductor chip 421 and a second diode chip 422.

FIG. 5 is a plane view showing an example of an internal layout of the double-sided cooling power module 200 shown in FIG. 2. As shown in FIG. 5, the double-sided cooling power module 200 having two switches includes: a 1-$1^{st}$ horizontal spacer 511 and a 1-$2^{nd}$ horizontal spacer 512 for connecting a positive electrode terminal (+) and an output terminal in a first switch 510; a 2-$1^{st}$ horizontal spacer 521 and a 2-$2^{nd}$ horizontal spacer 522 for connecting a negative electrode terminal (−) and an output terminal in a second switch 520; a first vertical spacer 252-1 for connecting the same output terminals; and a second vertical spacer 252-2 for connecting the same negative electrode terminals. That is to say, a total of six spacers are required.

FIG. 6A is a plane view showing another example of an internal layout of the double-sided cooling power module 200 shown in FIG. 2. As shown in FIG. 6A, one horizontal spacer 610 is substituted for the two horizontal spacers 511 and 512 shown in FIG. 5, and one horizontal spacer 620 is substituted for the two horizontal spacers 521 and 522 shown in FIG. 5. In addition, the spacers having the same polarity are unified to one spacer, respectively, thereby having a structure of enhancing a thermal diffusion effect. Such a structure has an effect of integrating spacers as well as improvement of a thermal performance, and a process of disposing spacers on a chip in a manufacturing process is reduced from six times to four times, thereby improving the process.

Figure 6B:
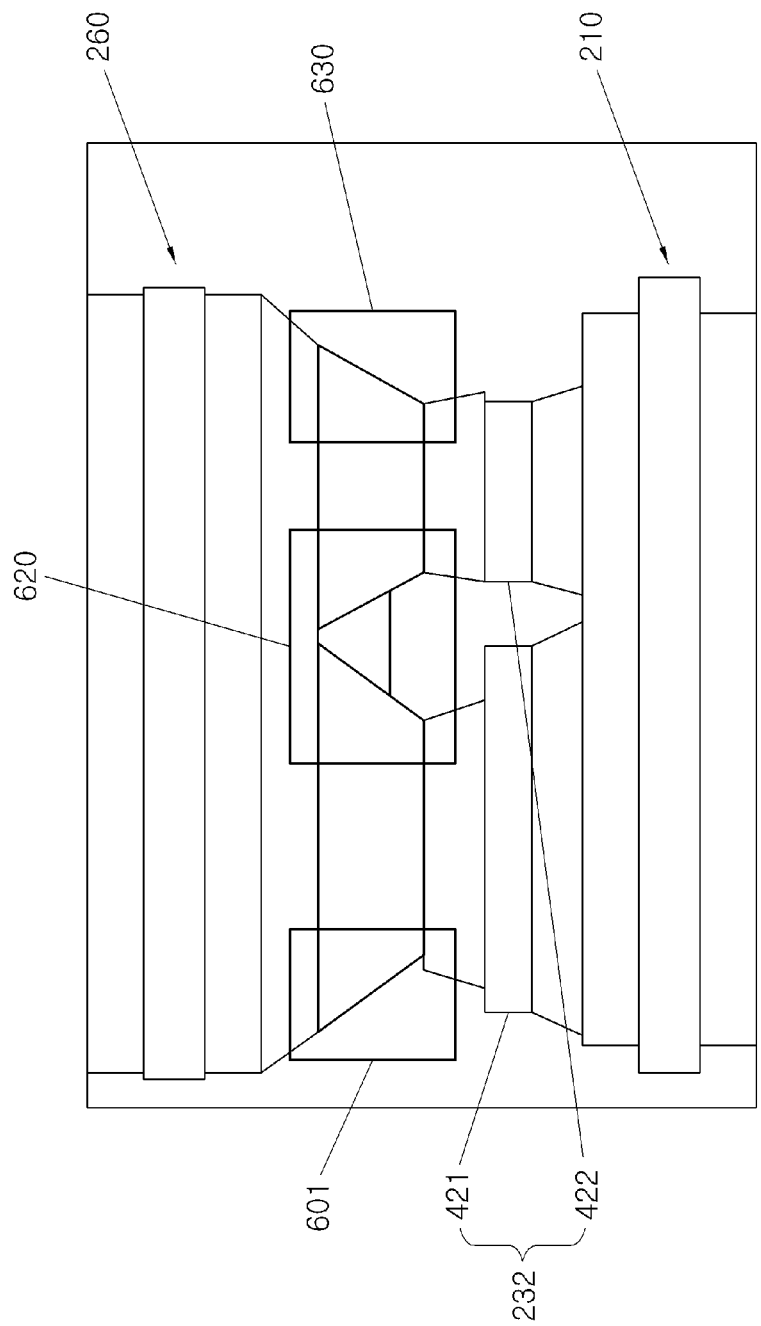
FIG. 6B is a cross-sectional view taken along line A-A' in FIG. 6A.

FIG. 6B is a cross-sectional view taken along line A-A in FIG. 6A. As shown in FIG. 6B, a second horizontal spacer 620 has a shape having a gradient 601 so that an area in contact with the upper-end terminal (260 of FIG. 2) can be wider than an area in contact with the second power semiconductor chip 232. In other words, the second horizontal spacer 620 is formed so that an area in contact with the conductive ceramic plate 262 of the upper-end terminal (260 of FIG. 2) is wider than an area in contact with the second power semiconductor chip 232, thereby improving a thermal performance. That is, the horizontal spacer is formed in a shape of having a gradient, thereby further improving the thermal performance. Although the above description is given on the second horizontal spacer 620 with reference to FIG. 6B, the same structure can be applied to the first horizontal spacer 610.

Figure 7:
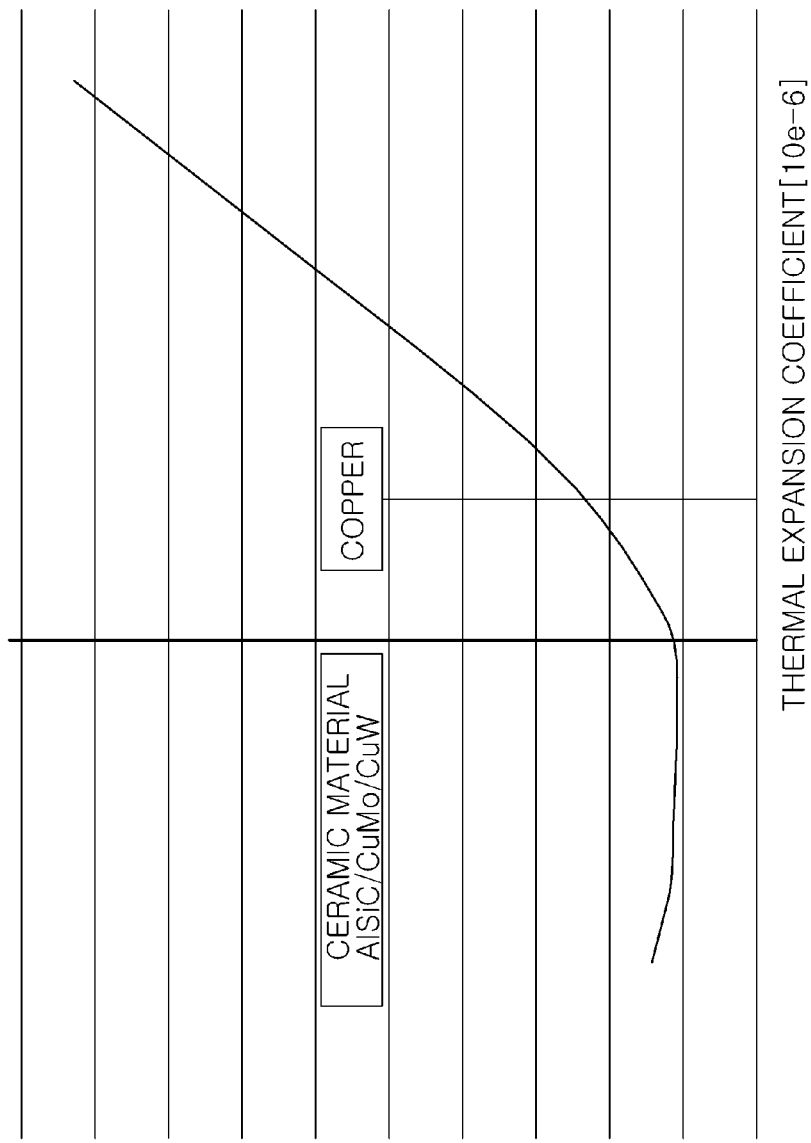
FIG. 7 is a graph showing a relation between a thermal expansion coefficient and the deformation amount of solder according to materials of a spacer in accordance with an embodiment of the present disclosure.

FIG. 7 is a graph showing a relation between a thermal expansion coefficient and the deformation amount of solder according to materials of a spacer in accordance with an embodiment of the present disclosure. The spacers must be made of a material which has an excellent electrical and/or thermal conductivity, and has a thermal expansion coefficient similar to those of the power semiconductor chip and conductive ceramic plate for ensuring the reliability of a package.

As shown in FIG. 7, when the spacers are made of a metal-based material, such as copper, aluminum, or the like, a thermal performance is improved. However, in this case, the difference between thermal expansion coefficients becomes large, so that stress is concentrated on the solder to largely deteriorate the reliability.

Figure 8:
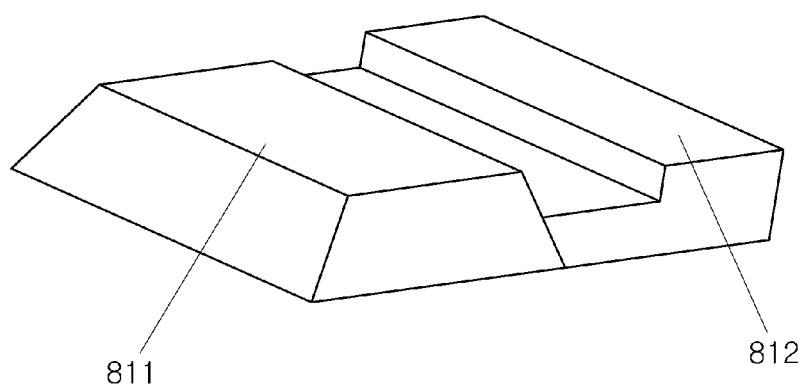
FIG. 8 is a view showing a first example of a shape applied for a spacer shown in FIG. 6A.
Figure 9:
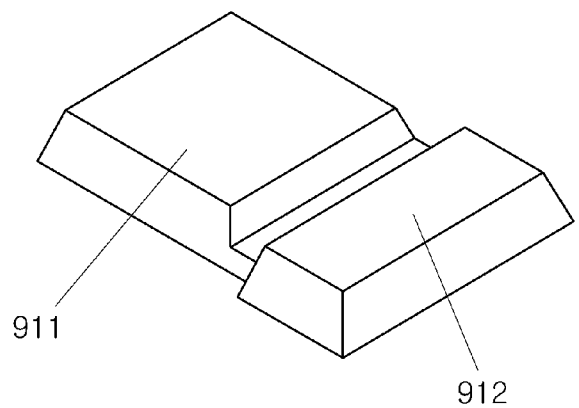
FIG. 9 is a view showing a second example of a shape applied for a spacer shown in FIG. 6A.
Figure 10:
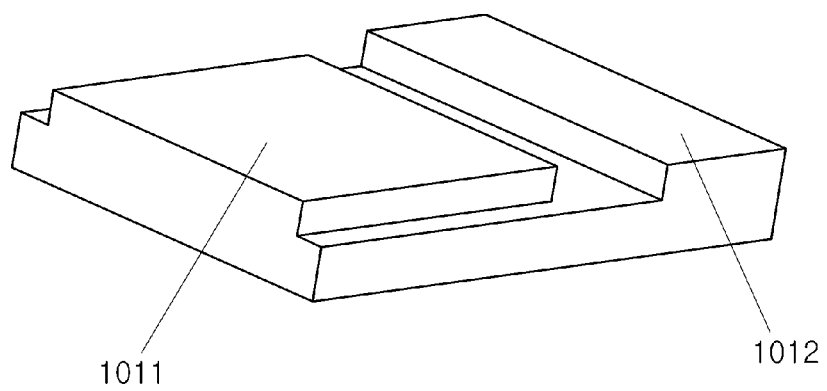
FIG. 10 is a view showing a third example of a shape applied for a spacer shown in FIG. 6A.

FIGS. 8 to 10 are views showing examples of shapes applied for a horizontal spacer shown in FIG. 6A. FIG. 8 is a view showing a first example of the shape applied for a spacer shown in FIG. 6A. As shown in FIG. 8, a horizontal spacer is constituted by a horizontal spacer 811 for a chip, which faces the upper end surface of a semiconductor chip, and a horizontal spacer 812 for a diode. In addition, the horizontal spacer 811 for a chip is formed to have a cross section of an isosceles quadrangle shape, and the horizontal spacer 812 for a diode is formed to have a cross section of a rectangle shape.

FIG. 9 is a view showing a second example of a shape applied for a spacer shown in FIG. 6B. As shown in FIG. 9, a horizontal spacer 911 for a chip and a horizontal spacer 912 for a diode are both formed to have a cross section of an isosceles quadrangle shape, wherein the horizontal spacer 912 for a diode is formed to have a longer length than the horizontal spacer 911 for a chip.

FIG. 10 is a view showing a third example of a shape applied for a spacer shown in FIG. 2. As shown in FIG. 10, a horizontal spacer 1011 for a chip is formed to have a cross section having a step, and a horizontal spacer 1012 for a diode is formed to have a cross section of a rectangle shape.

Figure 11:
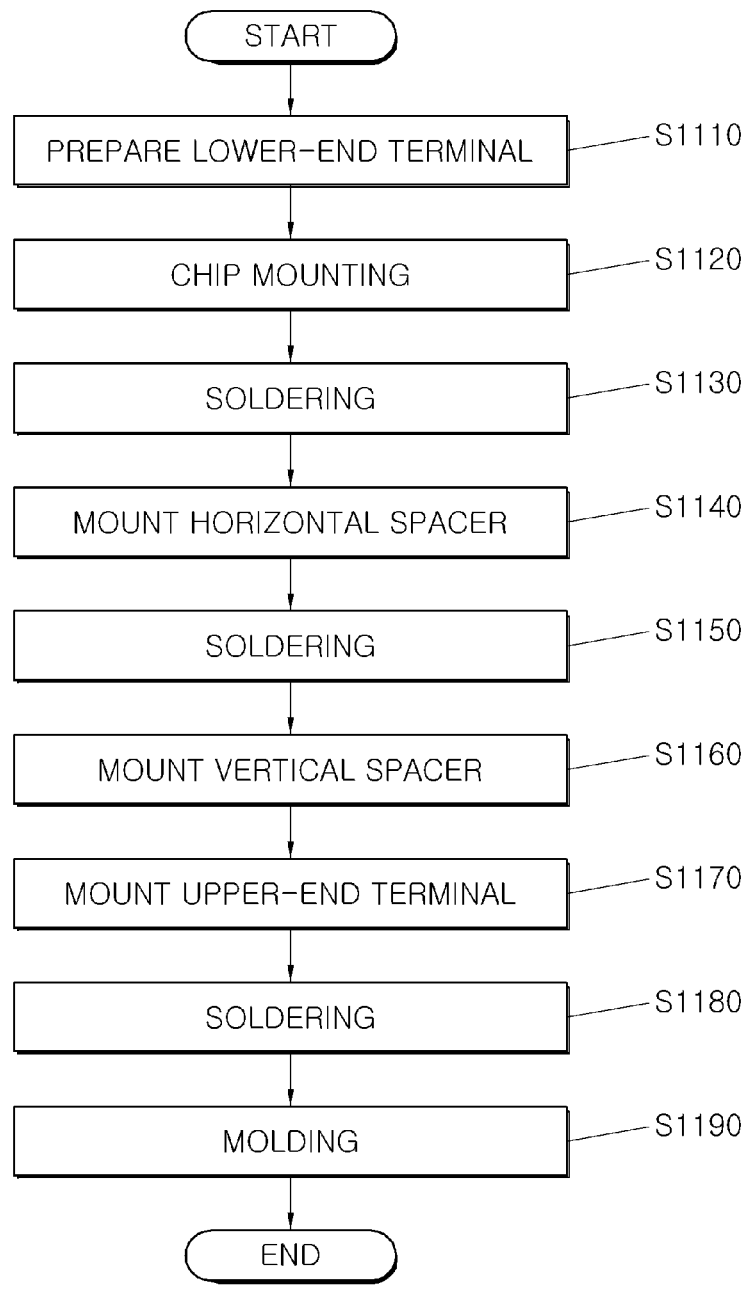
FIG. 11 is a flowchart showing a procedure of manufacturing a double-sided cooling power module in accordance with another embodiment of the present disclosure.

FIG. 11 is a flowchart showing a procedure of manufacturing a double-sided cooling power module in accordance with embodiments of the present disclosure. As shown in FIG. 11, the lower-end terminal (210 of FIG. 2) is prepared in step S1110.

The power semiconductor chips (231 and 232 of FIG. 2) are mounted and soldered on the lower-end terminal 210 in steps S1120 and 1130. After the soldering, the horizontal spacers 251-1 and 251-2 are disposed and soldered on the power semiconductor chips 231 and 232 in steps S1140 and 1150. After the soldering, the vertical spacers (252-1 and 252-2 of FIG. 2) are mounted to be spaced by a predetermined distance from the horizontal spacers 251-1 and 251-2 in step S1160. After the vertical spacers are mounted, the upper-end terminal (260 of FIG. 2) is mounted and soldered in steps S1170 and S1180. Finally, in the state in which the horizontal spacers, the vertical spacers, the upper-end terminal, and so on are assembled, a housing is formed by performing molding in step S1190.

In accordance with the embodiments of the present disclosure, since the spacers promote thermal diffusion, a thermal performance can be improved. In addition, the spacers are made of a ceramic material, so that reliability can be improved. Furthermore, the spacers are integrated, so that the simplification of the process and reduction of cost can be achieved.

While the present disclosure has been described with respect to the specific embodiments, it will be apparent to those skilled in the art that various changes and modifications may be made without departing from the spirit and scope of the disclosure as defined in the following claims.

What is claimed is:
1. A double-sided cooling power module comprising:
 a lower-end terminal;
 at least one pair of power semiconductor chips mounted on the lower-end terminal;
 at least one pair of horizontal spacers mounted on the at least one pair of power semiconductor chips;
 an upper-end terminal mounted on the at least one pair of horizontal spacers; and
 at least one pair of vertical spacers disposed between the upper-end terminal and the lower-end terminal.

2. The double-sided cooling power module of claim 1, wherein the at least one pair of vertical spacers are configured to adjust a height between the upper-end terminal and the lower-end terminal.

3. The double-sided cooling power module of claim 1, wherein the at least one pair of vertical spacers are configured to electrically connect the upper-end terminal to the lower-end terminal.

4. The double-sided cooling power module of claim 1, wherein the at least one pair of vertical spacers and the at least one pair of horizontal spacers are made of a conductive ceramic material.

5. The double-sided cooling power module of claim 1, wherein the at least one pair of horizontal spacers are configured to have a gradient so that an area of the at least one pair of horizontal spacers in contact with the upper-end terminal is wider than an area of the at least one pair of horizontal spacers in contact with the at least one pair of power semiconductor chips.

6. The double-sided cooling power module of claim 1, wherein the upper-end terminal includes:
   a first copper plate configured to form an output terminal and one electrode terminal;
   a second copper plate configured to be contacted by an external component; and
   a conductive ceramic plate disposed between the first copper plate and the second copper plate.

7. The double-sided cooling power module of claim 1, wherein the lower-end terminal includes:
   a first copper plate configured to form an output terminal and two electrode terminals with the output terminal therebetween;
   a second copper plate configured to be contacted by an external component; and
   a conductive ceramic plate disposed between the first copper plate and the second copper plate.

8. The double-sided cooling power module of claim 1, wherein the upper-end terminal or the lower-end terminal is made of direct bonded copper (DBC).

9. The double-sided cooling power module of claim 1, wherein the at least one pair of power semiconductor chips are configured to include a semiconductor chip portion and a diode chip portion, and the at least one pair of horizontal spacers include a pair of spacers which face the semiconductor chip portion and the diode chip portion, respectively.

10. The double-sided cooling power module of claim 1, wherein the at least one pair of power semiconductor chips are configured to include a semiconductor chip portion and a diode chip portion, and the at least one pair of horizontal spacers include a spacer having a unified shape so as to face both of the semiconductor chip portion and the diode chip portion.

11. The double-sided cooling power module of claim 1, wherein the at least one pair of vertical spacers are configured to connect electrode terminals or output terminals having an equal polarity to each other.

12. The double-sided cooling power module of claim 1, wherein the at least one pair of power semiconductor chips and the upper-end terminal, the at least one pair of horizontal spacers and the at least one pair of power semiconductor chips, and the at least one pair of horizontal spacers and the upper-end terminal are respectively attached to one another via soldering.

13. The double-sided cooling power module of claim 1, further comprising:
   a housing formed by molding in a state in which the lower-end terminal, the at least one pair of power semiconductor chips, the at least one pair of horizontal spacers, the upper-end terminal, and the at least one pair of vertical spacers have been assembled.

14. A method for manufacturing double-sided cooling power module comprising:
   preparing a lower-end terminal;
   mounting at least one pair of power semiconductor chips on the lower-end terminal;
   mounting at least one pair of horizontal spacers on the at least one pair of power semiconductor chips;
   mounting at least one pair of vertical spacers to be spaced by a predetermined distance from the at least one pair of horizontal spacers; and
   mounting an upper-end terminal on the at least one pair of horizontal spacers and the at least one pair of vertical spacers,
   wherein the at least one pair of vertical spacers are disposed between the upper-end terminal and the lower-end terminal.

15. The method of claim 14, wherein the at least one pair of vertical spacers are configured to adjust a height between the upper-end terminal and the lower-end terminal.

16. The method of claim 14, wherein the at least one pair of vertical spacers are configured to electrically connect the upper-end terminal to the lower-end terminal.

17. The method of claim 14, wherein the at least one pair of vertical spacers and the at least one pair of horizontal spacers are made of a conductive ceramic material.

18. The method of claim 14, wherein the at least one pair of horizontal spacers are configured to have a gradient so that an area of the at least one pair of horizontal spacers in contact with the upper-end terminal is wider than an area of the at least one pair of horizontal spacers in contact with the at least one pair of power semiconductor chips.

19. The method of claim 14, further comprising:
   attaching the at least one pair of power semiconductor chips and the upper-end terminal, the at least one pair of horizontal spacers and the at least one pair of power semiconductor chips, and the at least one pair of horizontal spacers and the upper-end terminal to one another, respectively, using a soldering scheme.

20. The method of claim 14, further comprising:
   forming a housing by molding in a state in which the lower-end terminal, the at least one pair of power semiconductor chips, the at least one pair of horizontal spacers, the upper-end terminal, and the at least one pair of vertical spacers have been assembled.

* * * * *